(12) United States Patent
Lu et al.

(10) Patent No.: US 11,302,681 B2
(45) Date of Patent: Apr. 12, 2022

(54) DISPLAY DEVICE AND METHOD OF MANUFACTURING THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Macai Lu, Shenzhen (CN); Minggang Liu, Shenzhen (CN)

(73) Assignee: SHENZHEN CHINA STAR OPTOELECTRONICS SEMICONDUCTOR DISPALY TECHNOLOGY CO., LTD., Shenzhen (CN)

( * ) Notice: Subject to any disclaimer, the term of this patent is extended or adjusted under 35 U.S.C. 154(b) by 308 days.

(21) Appl. No.: 16/617,685

(22) PCT Filed: Sep. 20, 2019

(86) PCT No.: PCT/CN2019/107061
§ 371 (c)(1),
(2) Date: Nov. 27, 2019

(87) PCT Pub. No.: WO2021/022635
PCT Pub. Date: Feb. 11, 2021

(65) Prior Publication Data
US 2022/0037297 A1    Feb. 3, 2022

(30) Foreign Application Priority Data
Aug. 5, 2019 (CN) .......................... 201910715570.1

(51) Int. Cl.
H01L 25/16 (2006.01)
H01L 27/12 (2006.01)

(52) U.S. Cl.
CPC ........ *H01L 25/167* (2013.01); *H01L 27/1259* (2013.01)

(58) Field of Classification Search
None
See application file for complete search history.

(56) References Cited

U.S. PATENT DOCUMENTS

2009/0278131 A1* 11/2009 Kwon ................. H01L 27/1288
257/72
2012/0074420 A1* 3/2012 Park .................... H01L 27/3246
257/72

(Continued)

*Primary Examiner* — Bo B Jang
(74) *Attorney, Agent, or Firm* — Osha Bergman Watanabe & Burton LLP

(57) ABSTRACT

A display device and a method of manufacturing thereof are provided. A display device includes an array substrate and a pixel electrode disposed on the array substrate. The pixel electrode includes a soldering region, a non-soldering region, a transparent conductive oxide layer formed on the array substrate, a first metal electrode layer disposed on the transparent conductive oxide layer of the soldering region and the non-soldering region, a second metal protective layer disposed on the first metal electrode layer of the non-soldering region, and a micro LED chip including a pin correspondingly soldered on the first metal electrode layer of the soldering region. The metal electrode layer easily reacted with the organic solvent or the organic film to cause residue or defects can be improved, and the first metal electrode layer is merely retained to provide a solder joint for soldering the micro LED chip without affecting subsequent processes.

10 Claims, 4 Drawing Sheets

(56) References Cited

U.S. PATENT DOCUMENTS

| | | | |
|---|---|---|---|
| 2015/0371977 A1* | 12/2015 | Huang | H01L 21/0217 |
| | | | 257/741 |
| 2016/0141339 A1* | 5/2016 | Prushinskiy | H01L 51/5225 |
| | | | 257/40 |
| 2016/0372514 A1* | 12/2016 | Chang | G09G 3/2003 |
| 2018/0122875 A1* | 5/2018 | Bang | H01L 51/5203 |
| 2020/0124743 A1* | 4/2020 | Usui | G21F 3/00 |
| 2021/0225823 A1* | 7/2021 | Liang | H01L 24/06 |

* cited by examiner

DISPLAY DEVICE AND METHOD OF MANUFACTURING THEREOF

BACKGROUND OF INVENTION

Field of Invention

The present invention relates to a field of display technology, and more particularly, to a display device and a method of manufacturing thereof.

Description of Prior Art

As an emerging display technology, micro light emitting diode (LED) displays have many advantages compared to liquid crystal displays (LCDs) and organic light emitting diode (OLED) displays, such as lower power consumption, higher color gamut, faster response times, etc. They do not need a high level of blocking moisture during packaging, and thus it is regarded as a promising display technology. Accordingly, many panel manufacturers are involved in the development of micro LED technology, but there are still many technical difficulties in the micro LED display, such as massive transfer, bonding, etc., and should be improved. As for the bonding between the thin film transistor for driving the micro LED chip and the micro LED chip, it is necessary to ensure that the metal electrode layer in the pixel electrode connected to the thin film transistor is not corroded in the subsequent process, so that the metal electrode layer in the pixel electrode can be bonded with the micro LED chip. In the manufacturing process for the display devices, an organic layer process is required after patterning the metal electrode layer in the pixel electrode, or the metal electrode layer easily reacts with the organic solvent or the organic film in the subsequent process to cause residue or defects.

SUMMARY OF INVENTION

In order to solve the above technical problems, a display device and a method of manufacturing thereof are provided. The metal electrode layer is easily reacted with the organic solvent or the organic film in the subsequent process to cause residue or defects, and it can be improved by adding a metal protective layer on the metal electrode layer of the pixel electrode in the non-soldering region. Meanwhile, the first metal electrode layer is merely retained to provide a solder joint for soldering the Micro LED chip without affecting subsequent processes.

A display device includes an array substrate and a pixel electrode disposed on the array substrate. The pixel electrode includes a soldering region, a non-soldering region, a transparent conductive oxide layer formed on the array substrate, a first metal electrode layer disposed on the transparent conductive oxide layer of the soldering region and the non-soldering region, a second metal protective layer disposed on the first metal electrode layer of the non-soldering region, a micro light emitting diode (LED) chip. The micro LED chip includes a pin, and the pin is correspondingly soldered on the first metal electrode layer of the soldering region.

In one embodiment, material of the transparent conductive oxide layer includes one of indium tin oxide, aluminum-doped zinc oxide, and indium zinc oxide, and material of the first metal electrode layer includes copper, and material of the second metal protective layer includes molybdenum, titanium, and molybdenum titanium alloy.

In one embodiment, the array substrate includes a substrate, a buffer layer disposed on the substrate, an active layer disposed on the buffer layer, a gate insulating layer disposed on the active layer, a gate layer disposed on the gate insulating layer, an interlayer dielectric layer overlying the gate layer, the active layer, and the buffer layer, and a source, a drain, and a common electrode disposed on the interlayer dielectric layer, in which the source and the drain are connected to the active layer, and a planar layer overlying the source, the drain, and the interlayer dielectric layer. The pixel electrode is disposed on the planar layer and connected to the drain and the common electrode, and a pixel defining layer is disposed on the second metal protective layer of the non-soldering region.

In one embodiment, the source and the drain are presented as a metal laminated structure or a metal single layer structure, the metal laminated structure includes one of a copper/molybdenum laminated layer, a copper/molybdenum titanium alloy laminated layer, a copper/titanium laminated layer, and an aluminum/molybdenum laminated layer, and the metal single layer structure comprises one of a molybdenum titanium alloy and a copper niobium alloy.

In one embodiment, the display device further includes a packaging layer, and the packaging layer is configured to package the micro LED chip.

A method of manufacturing a display device includes steps of:
providing an array substrate;
forming a transparent conductive oxide layer on the array substrate;
forming a first metal electrode layer on the transparent conductive oxide layer of a soldering region and a non-soldering region;
forming a second metal protective layer on the first metal electrode layer of the soldering region and the non-soldering region;
removing the second metal protective layer of the soldering region, and the transparent conductive oxide layer, the first metal electrode layer, and the second metal protective layer forms a pixel electrode; and
providing a micro light emitting diode (LED) chip, and the micro LED chip includes a pin, and the micro LED chip is soldered to the first metal electrode layer of the soldering region through the pin.

In one embodiment, the method of manufacturing a display device further includes following steps before removing the second metal protective layer of the soldering region, and the steps include:
depositing a pixel defining material on the array substrate and entire second metal protective layer; and
providing a mask, and the mask is disposed on the pixel defining material, and the pixel defining material of the soldering region is removed by exposure and development processes, and a pixel defining layer is formed in the non-soldering region.

In one embodiment, step of removing the second metal protective layer of the soldering region includes removing the second metal protective layer of the soldering region through dry etching.

In one embodiment, step of providing an array substrate includes following steps:
providing a substrate;
depositing a buffer material on the substrate to form a buffer layer;
depositing an oxide semiconductor material on the buffer layer and patterning to form an active layer;

depositing a gate insulating material on the active layer and patterning to from a gate insulating layer;

depositing a metal material on the gate insulating layer and patterning to form a gate layer;

depositing an interlayer dielectric on the gate layer, the active layer, and the buffer layer to form an interlayer dielectric layer;

forming a first through hole penetrating the interlayer dielectric layer and extending to a surface of the active layer;

depositing a metal material in the first through hole and on the interlayer dielectric layer and patterning to form a common electrode, a source, and a drain, and the source and the drain are connected to the active layer;

forming a planar layer on the source, the drain, and the interlayer dielectric layer; and forming a second through hole penetrating the planar layer and extending to a surface of the drain and another second through hole penetrating the planar layer and extending to a surface of the common electrode in a drain corresponding region and a common electrode corresponding region; and step of forming a transparent conductive oxide layer on the array substrate includes depositing a transparent conductive oxide on a surface of the second through hole and the planar layer to form the transparent conductive oxide layer.

In one embodiment, the method of manufacturing a display device further includes forming a packaging layer on the micro LED chip, the pixel defining layer, and the planar layer.

The display device and the method of manufacturing thereof are provided. A metal protective layer is deposited on the metal electrode layer of the pixel electrode in the non-soldering region and the first metal electrode layer (copper layer) is merely exposed in the soldering region. The patterned layer, such as a pixel defining layer or a black matrix, is used as a self-aligned hard mask to etch a second metal protective layer having higher stability while retaining and exposing the first metal electrode layer (copper layer) of the soldering region. The first metal electrode layer (copper layer) is used as a main conductive trace of the micro LED chip and the array substrate. In the non-soldering region, the first metal electrode layer (copper layer) of non-soldering region can be protected from being corroded in the subsequent processes due to the presence of the second metal protective layer having higher stability.

BRIEF DESCRIPTION OF DRAWINGS

In order to more clearly illustrate the technical solutions in the embodiments of the present invention, the drawings used in the description of the embodiments are briefly described below. It is obvious that the drawings in the following description are only some embodiments of the present invention. Other drawings can also be obtained from those skilled persons in the art based on these drawings without paying any creative effort.

Figure 1:
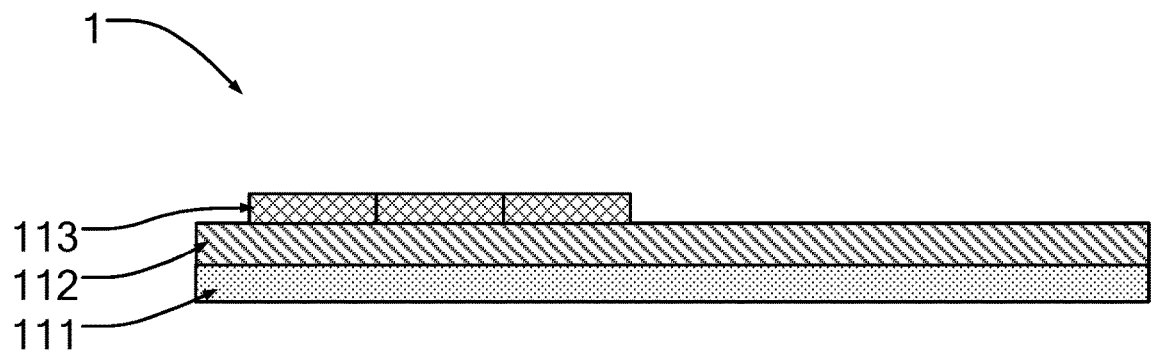
FIG. 1 is a structural view of a display device after forming an active layer according to one embodiment of the present invention.

Element reference:

display device 1; mask 2; array substrate 11; pixel electrode 12; pixel defining layer 13; micro LED chip 14; packaging layer 15; substrate 111; buffer layer 112; active layer 113; gate insulating layer 114; gate layer 115; interlayer dielectric layer 116; source 117; drain 118; common electrode 119; planar layer 110; first through hole 1161; second through hole 1101; soldering region 121; non-soldering region; transparent conductive oxide layer 123; first metal electrode layer 124; second metal protective layer 125; and pin 141.

DETAILED DESCRIPTION OF PREFERRED EMBODIMENTS

The embodiments of the present invention are described in detail below, and the examples of the embodiments are illustrated in the drawings, and the same or similar reference numerals indicate the same or similar elements or elements having the same or similar functions. The embodiments described below with reference to the drawings are intended to be illustrative of the invention and are not to be construed as limiting.

The following description of the embodiments is intended to be illustrative of the specific embodiments. The directional terms mentioned in the present invention, such as "upper," "lower," "front," "back," "left," "right," "top," "bottom," etc., are referred to as the direction of the drawings. Therefore, the directional terminology is used for the purpose of illustration and understanding of the invention rather than limiting the present invention.

Figure 8:
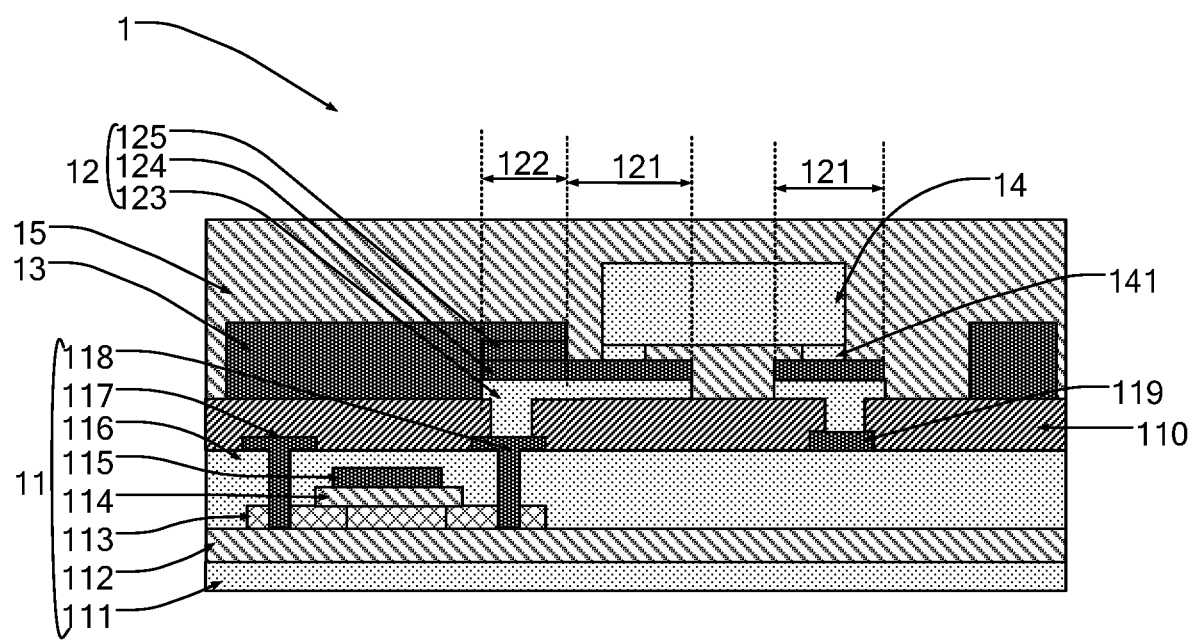
FIG. 8 is a structural view of a display device after forming a packaging layer according to on embodiment of the present invention.

Referring to FIG. 8, a display device 1 according to one embodiment of the present invention includes an array substrate 11, a pixel electrode 12, a pixel defining layer 13, a micro light emitting diode (LED) chip 14, and a packaging layer 15. FIG. 8 is a structural diagram of a pixel unit of a display device 1.

The array substrate 11 includes a substrate 111, a buffer layer 112, a gate insulating layer 114, a gate layer 115, an interlayer dielectric layer 116, a source 117, a drain 118, a common electrode 119, and a planar layer 110.

The substrate 111 is a glass substrate, the buffer layer 112 is disposed on a surface of the substrate 111, and buffer material of the buffer layer 112 includes at least one of silicon oxide, silicon nitride, silicon oxynitride, and aluminum oxide. In one embodiment, the buffer layer 112 formed by the buffer material may be a single layer structure, such as silicon nitride single layer, a silicon oxide single layer, etc., or may be a multilayer laminated structure, such as silicon nitride/silicon oxide laminated layer or aluminum oxide/silicon oxide laminated layer.

The active layer 113 is disposed on the buffer layer 112. The active layer 113 includes an oxide semiconductor material, and the oxide semiconductor material includes one of indium gallium zinc oxide (IGZO), indium zinc oxide (IZO), indium gallium oxide (IGO), indium gallium tin oxide (IGTO), and indium gallium zinc tin oxide (IGZTO).

The gate insulating layer 114 is disposed on the active layer 113. A gate insulating material used for the gate insulating layer 114 includes at least one of silicon oxide, silicon nitride, and aluminum oxide. The gate insulating layer 114 formed by the gate insulating material may be a single layer structure, such as a silicon nitride single layer, a silicon oxide single layer, etc., or may be a multilayer laminated structure, such as silicon nitride/silicon oxide laminated layer or aluminum oxide/silicon oxide laminated layer.

The gate layer 115 is disposed on the gate insulating layer 114. Material used for the gate layer 115 includes metal materials, such as copper, molybdenum, titanium, aluminum, niobium, or an alloy of the above metal materials, which may be selected. The gate layer 115 formed by the metal materials or an alloy thereof may be a single layer structure, such as a copper niobium alloy, a molybdenum titanium alloy, etc., or may be a multilayer laminated structure, such as copper/molybdenum laminated layer, copper/molybdenum titanium alloy laminated layer, copper/titanium laminated layer, aluminum/molybdenum laminated layer, etc.

The interlayer dielectric layer 116 overlies the gate layer 115, the active layer 113, and the buffer layer 112. The interlayer dielectric layer 116 includes a first through hole 1161 penetrating the interlayer dielectric layer 116 and extending to a surface of the active layer 113. Interlayer dielectric material used in the interlayer dielectric layer 116 includes at least one of silicon oxide, silicon nitride, and silicon oxynitride. In one embodiment, the interlayer dielectric layer 116 formed by the interlayer dielectric material may be single layer structure, such as a silicon nitride single layer, a silicon oxide single layer, etc., or a multilayer laminated structure, such as a silicon nitride/silicon oxide laminated layer.

Figure 3:
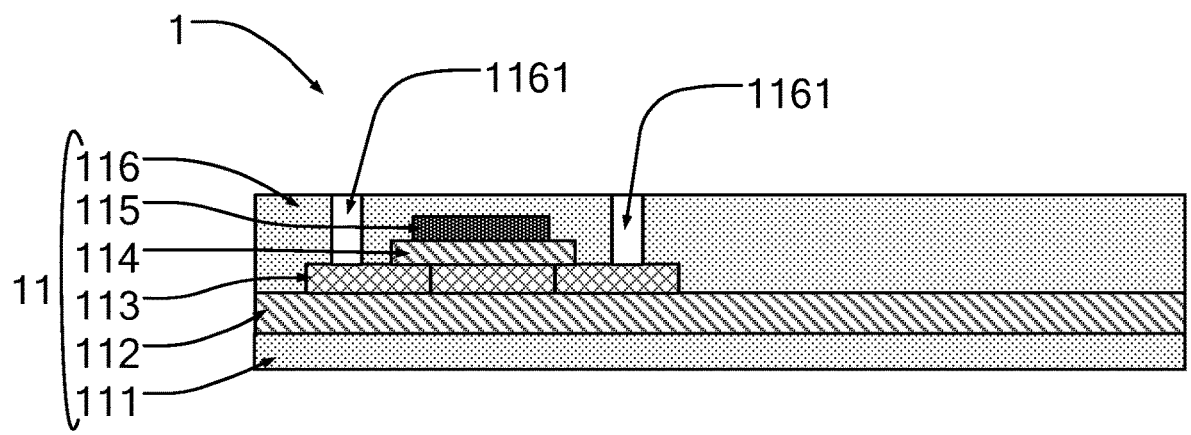
FIG. 3 is a structural view of a display device after forming a first through hole according to one embodiment of the present invention.

The source 117, the drain 118, and the common electrode 119 are disposed on the interlayer dielectric layer 116. Referring to FIG. 3, the source 117 and the drain 118 are connected to the active layer 113 through the first through hole 1161. The metal material used for the source 117, the drain 118, and the common electrode 119 may be selected from copper, molybdenum, titanium, aluminum, niobium, or an alloy thereof. The source 117, the drain 118, and the common electrode 119 formed by the metal material or the alloy thereof may be a metal single layer structure, such as a copper niobium alloy, a molybdenum titanium alloy, etc., or may be a metal laminated structure, such as copper/molybdenum laminated layer, copper/molybdenum titanium alloy laminated layer, copper/titanium laminated layer, aluminum/molybdenum laminated layer, etc.

The planar layer 110 overlies the source 117, the drain 118, and the interlayer dielectric layer 116. Material of the planar layer 110 includes at least one of silicon oxide, silicon nitride, and silicon oxynitride. In one embodiment, the planar layer 110 may be a single layer structure, such as a silicon nitride single layer, a silicon oxide single layer, etc., or may be a multilayer laminated structure, such as silicon nitride/silicon oxide laminated layer.

Figure 4:
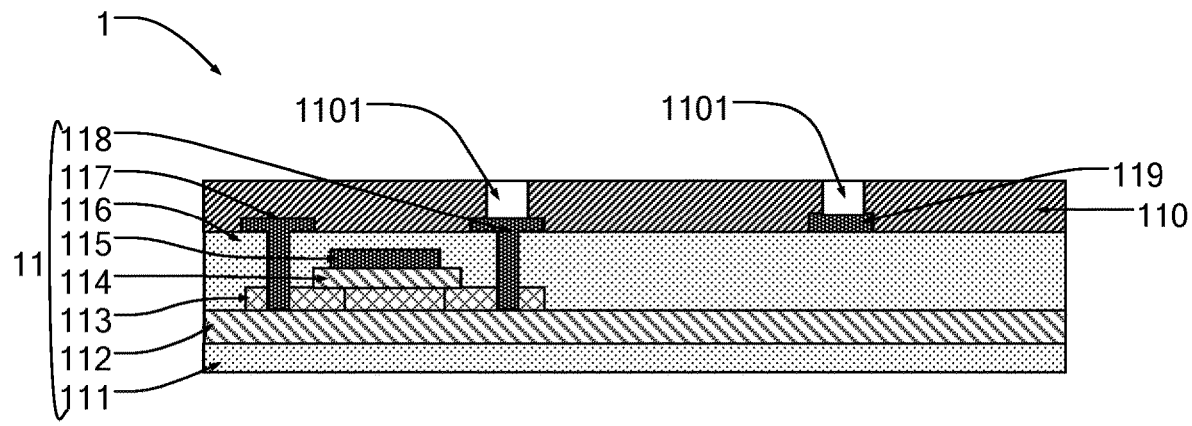
FIG. 4 is a structural view of a display device after forming a second through hole according to one embodiment of the present invention.

Referring to FIG. 4, in a drain 118 corresponding region and a common electrode 119 corresponding region, the planar layer 110 includes a second through hole 1101 penetrating the planar layer 110 and extending to a surface of the drain 118 and another second through hole 1101 penetrating the planar layer 110 and extending to a surface of the common electrode 119.

The pixel electrode 12 is disposed on the planar layer 110 and connected to the drain 118 and the common electrode 119 through the second through hole 1101. Specifically, the pixel electrode 12 includes a soldering region 121 and a non-soldering region 122. The pixel electrode 12 includes a transparent conductive oxide layer 123, a first metal electrode layer 124, and a second metal protective layer 125. The transparent conductive oxide layer 123 is formed on the planar layer 110 of the array substrate 11. Material used for the transparent conductive oxide layer 123 includes one of indium tin oxide, aluminum-doped zinc oxide, and indium zinc oxide. The first metal electrode layer 124 is disposed on the transparent conductive oxide layer 123 of the soldering region 121 and the non-soldering region 122. Material used for the first metal electrode layer 124 is copper. The second metal protective layer 125 is disposed on the first metal electrode layer 124 of the non-soldering region 122. Material used for the second metal protection layer 125 includes molybdenum, titanium, and molybdenum-titanium alloy. The second metal protective layer 125 is beneficial to protect the first metal electrode layer 124 from being corroded by liquid, which is used for forming a color resist, in a subsequent process.

The pixel defining layer 13 or a black matrix is disposed on the second metal protective layer 125 of the non-soldering region 122. The micro LED chip 14 is soldered on the metal region, which is the soldering region 121, and a pattern layer such as a pixel defining layer or a black matrix is used as a hard mask, and the second metal protection layer 125 of the pixel electrode 12 is etched, and the etching method may be a dry etching method. Only the second metal protective layer 125 on the upper surface of the first metal electrode layer 124 in the soldering region 121 may be etched during etching process, and the first metal electrode layer 124 is retained.

The micro LED chip 14 includes a pin 141, and the pin 141 is correspondingly soldered to the first metal electrode layer 124 of the soldering region 121. In one embodiment, the flip-chip micro LED chip 14 is taken as an example. Actually, a vertical Micro LED chip 14 can be connected to the first metal electrode through bonding and vapor deposition.

The display device 1 further includes a packaging layer 15 overlying the micro LED chip 14, the pixel defining layer 13, and the planar layer 110 for packaging the micro LED chip 14.

In order to explain the display device 1 of the present invention more clearly, the embodiment further includes a method of manufacturing the display device 1, and steps are described as follows.

Figure 2:
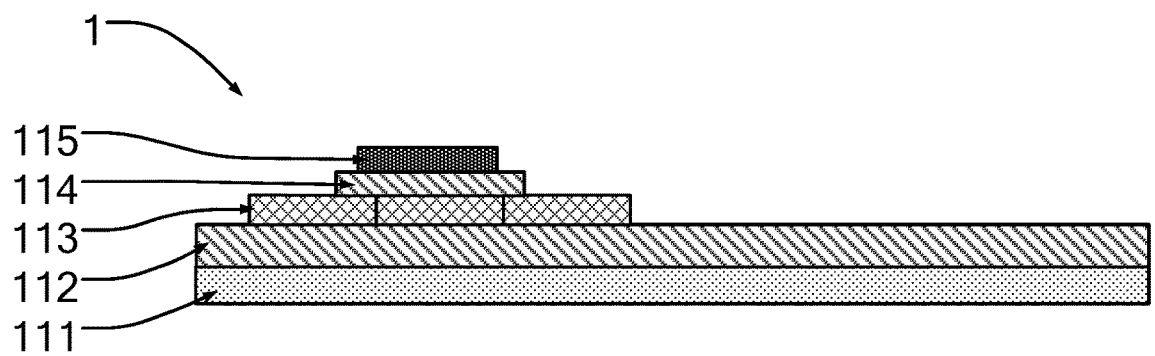
FIG. 2 is a structural view of a display device after forming a gate layer according to one embodiment of the present invention.

A step of providing an array substrate 11 includes the steps described as follows. Referring to FIG. 1, a substrate 111 is provided, and the substrate 111 is a transparent glass substrate. A buffer material is deposited on the substrate 111 to form a buffer layer 112, and the buffer material used for the buffer layer 112 includes at least one of silicon oxide, silicon nitride, silicon oxynitride, and aluminum oxide, and the buffer layer 112 formed by the buffer material may be a single layer structure, such as a silicon nitride single layer, a silicon oxide single layer, etc., or may be a multilayer laminated structure, such as silicon nitride/silicon oxide laminated layer or alumina/silicon oxide laminated layer. An oxide semiconductor material is deposited on the buffer layer 112 and patterned to form an active layer 113. The active layer 113 includes an oxide semiconductor material, and the oxide semiconductor material includes one of indium gallium zinc oxide (IGZO), indium zinc oxide (IZO), indium gallium oxide (IGO), indium gallium tin oxide (IGTO), and indium gallium zinc tin oxide (IGZTO). Referring to FIG. 2, a gate insulating material is deposited on the active layer 113 and patterned to from a gate insulating layer 114. A gate insulating material used for the gate insulating layer 114 includes at least one of silicon oxide, silicon nitride, and aluminum oxide. The gate insulating layer 114 formed by the gate insulating material may be a single layer structure, such as a silicon nitride single layer, a silicon oxide single layer, etc., or may be a multilayer laminated structure, such as silicon nitride/silicon oxide laminated layer or aluminum oxide/silicon oxide laminated layer. A metal material is deposited on the gate insulating layer 114 and patterned to form a gate layer 115. Material used for the gate layer 115 includes metal materials, such as copper, molybdenum, titanium, aluminum, niobium, or an alloy of the above metal materials, which may be selected. The gate layer 115 formed by the metal materials or an alloy thereof may be a single layer structure, such as a copper niobium alloy, a molybdenum titanium alloy, etc., or may be a multilayer laminated structure, such as copper/molybdenum laminated layer, copper/molybdenum titanium alloy laminated layer, copper/titanium laminated layer, aluminum/molybdenum laminated layer, etc. Referring to FIG. 3, an interlayer dielectric is deposited on the gate layer 115, the active layer 113, and the buffer layer 112 to form an interlayer dielectric layer 116. Interlayer dielectric material used in the interlayer dielectric layer 116 includes at least one of silicon oxide, silicon nitride, and silicon oxynitride. In one embodiment, the interlayer dielectric layer 116 formed by the interlayer dielectric material may be single layer structure, such as a silicon nitride single layer, a silicon oxide single layer, etc., or a multilayer laminated structure, such as a silicon nitride/silicon oxide laminated structure. A first through hole 1161 is formed to penetrate the interlayer dielectric layer 116 and extend to a surface of the active layer 113. Referring to FIG. 4, a metal material is deposited in the first through hole 1161 and on the interlayer dielectric layer 116 and patterned to form a common electrode 119, a source 117, and a drain 118, and the source 117 and the drain 118 are connected to the active layer 113. The metal material used for the source 117, the drain 118, and the common electrode 119 may be selected from copper, molybdenum, titanium, aluminum, niobium, or an alloy thereof. The source 117, the drain 118, and the common electrode 119 formed by the metal material or the alloy thereof may be a metal single layer structure, such as a copper niobium alloy, a molybdenum titanium alloy, etc., or may be a metal laminated structure, such as copper/molybdenum laminated layer, copper/molybdenum titanium alloy laminated layer, copper/titanium laminated layer, aluminum/molybdenum laminated layer, etc. A planar layer 110 is formed on the source 117, the drain 118, and the interlayer dielectric layer 116. Material of the planar layer 110 includes at least one of silicon oxide, silicon nitride, and silicon oxynitride. The planar layer 110 may be a single layer structure, such as a silicon nitride single layer, a silicon oxide single layer, etc., or may be a multilayer laminated structure, such as silicon nitride/silicon oxide laminated layer. A second through hole 1101 is formed to penetrate the planar layer 110 and extend to a surface of the drain 117 and another second through hole 1101 is formed to penetrates the planar layer 110 and extend to a surface of the common electrode 119 in a source 117 corresponding region and a common electrode 119 corresponding region.

Figure 5:
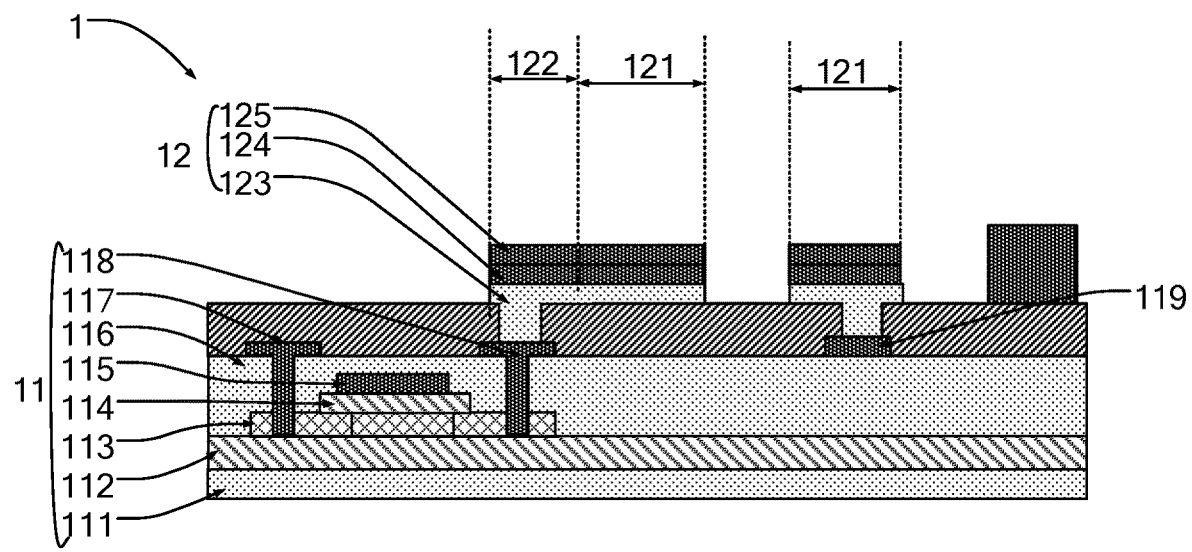
FIG. 5 is a structural view of a display device when a pixel electrode is formed and a second metal protective layer of a soldering region is removed according to one embodiment of the present invention.

Referring to FIG. 5, a transparent conductive oxide layer 123 is formed on the array substrate 11. Specifically, a transparent conductive oxide is deposited on a surface of the second through hole 1101 and the planar layer 110 to form the transparent conductive oxide layer 123. Material of the transparent conductive oxide layer 123 includes one of indium tin oxide, aluminum-doped zinc oxide, and indium zinc oxide. A first metal electrode layer 124 is formed on the transparent conductive oxide layer 123 of a soldering region 121 and a non-soldering region 122. Specifically, material used for the first metal electrode layer 124 is copper. The second metal protective layer 125 is disposed on the first metal electrode layer 124 of the soldering region 121 and the non-soldering region 122. Material used for the second metal protection layer 125 includes molybdenum, titanium, and molybdenum-titanium alloy. The second metal protective layer 125 is beneficial to protect the first metal electrode layer 124 from being corroded by liquid, which is used for forming a color resist, in a subsequent process.

Figure 6:
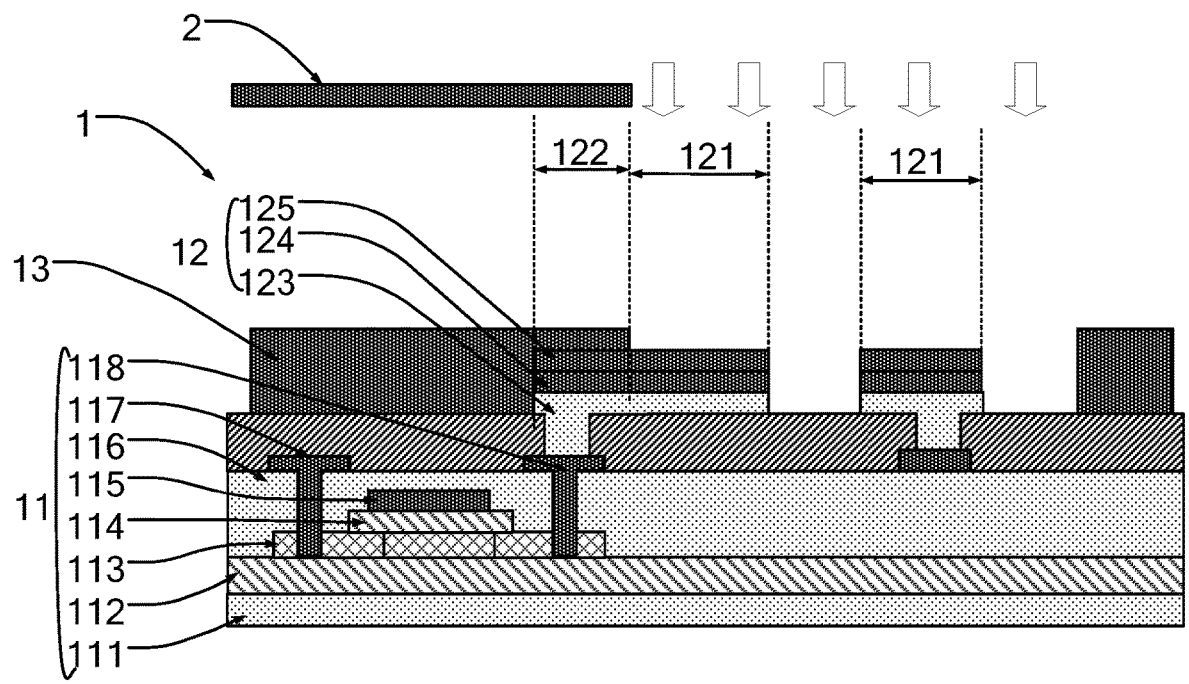
FIG. 6 is a structural view of a display device after forming a pixel defining layer in an embodiment of the present invention.

Referring to FIG. 6 following steps before removing the second metal protective layer 125 of the soldering region 121 includes depositing a pixel defining material on the array substrate 11 and entire second metal protective layer 125; and providing a mask 2. The mask 2 is disposed on the pixel defining material, and the pixel defining material of the soldering region 121 is removed by exposure and development processes, and a pixel defining layer 13 is formed in the non-soldering region 122. As shown in FIG. 6, the white downward arrow is an illumination light.

Figure 7:
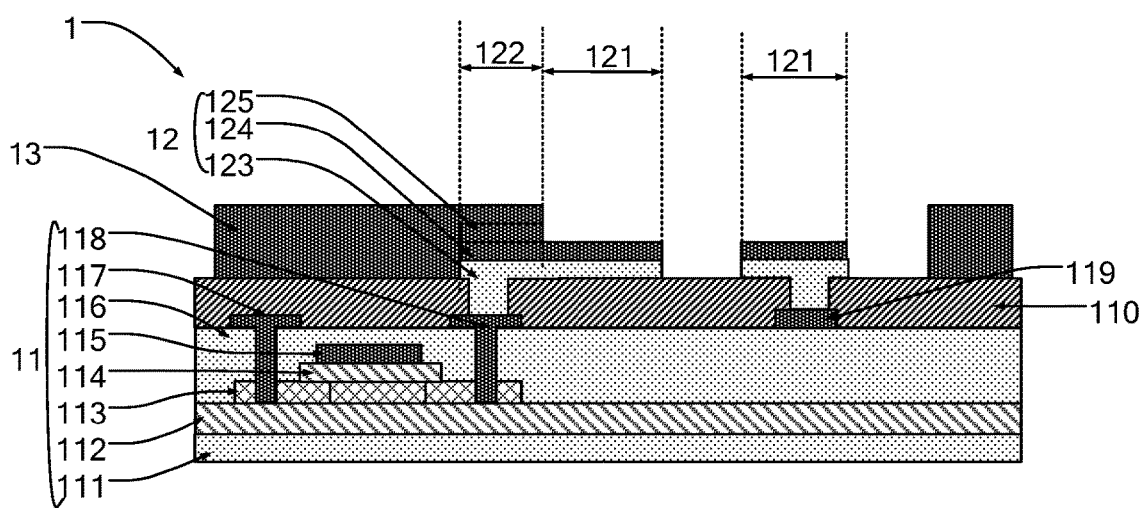
FIG. 7 is a structural view of a display device after removing a second metal protective layer of the soldering region according to one embodiment of the present invention.

Referring to FIG. 7, the second metal protective layer 125 of the soldering region 121 is removed through dry etching. The transparent conductive oxide layer 123, the first metal electrode layer 124, and the etched second metal protective layer 125 form a pixel electrode 12.

Referring to FIG. 8, a micro light emitting diode (LED) chip is provided, and the micro LED chip includes a pin 141, and the micro LED chip 14 is soldered to the first metal electrode layer 124 of the soldering region 121 through the pin 141. A packaging layer 15 is formed on the micro LED chip 14, the pixel defining layer 13, and the planar layer 110. The packaging layer 15 is a protective film made by alternately depositing organic/inorganic layers, and has a function of blocking moisture and preventing damage caused by mechanical collision.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:
1. A display device, comprising:
an array substrate; and
a pixel electrode disposed on the array substrate;
wherein the pixel electrode comprises:
a soldering region;
a non-soldering region;
a transparent conductive oxide layer formed on the array substrate;

a first metal electrode layer disposed on the transparent conductive oxide layer of the soldering region and the non-soldering region;

a second metal protective layer disposed on the first metal electrode layer of the non-soldering region;

a micro light emitting diode (LED) chip, wherein the micro LED chip comprises a pin, and the pin is correspondingly soldered on the first metal electrode layer of the soldering region.

2. The display device according to claim 1, wherein material of the transparent conductive oxide layer comprises one of indium tin oxide, aluminum-doped zinc oxide, and indium zinc oxide;

material of the first metal electrode layer comprises copper; and material of the second metal protective layer comprises molybdenum, titanium, and molybdenum titanium alloy.

3. The display device according to claim 1, wherein the array substrate comprises:

a substrate;

a buffer layer disposed on the substrate;

an active layer disposed on the buffer layer;

a gate insulating layer disposed on the active layer;

a gate layer disposed on the gate insulating layer;

an interlayer dielectric layer overlying the gate layer, the active layer, and the buffer layer;

a source, a drain, and a common electrode disposed on the interlayer dielectric layer, wherein the source and the drain are connected to the active layer;

a planar layer overlying the source, the drain, and the interlayer dielectric layer, wherein the pixel electrode is disposed on the planar layer and connected to the drain and the common electrode; and a pixel defining layer disposed on the second metal protective layer of the non-soldering region.

4. The display device according to claim 3, wherein the source and the drain are presented as a metal laminated structure or a metal single layer structure, the metal laminated structure comprises one of a copper/molybdenum laminated layer, a copper/molybdenum titanium alloy laminated layer, a copper/titanium laminated layer, and an aluminum/molybdenum laminated layer, and the metal single layer structure comprises one of a molybdenum titanium alloy and a copper niobium alloy.

5. The display device according to claim 1, further comprising a packaging layer, wherein the packaging layer is configured to package the micro LED chip.

6. A method of manufacturing a display device, comprising the steps of:

providing an array substrate;

forming a transparent conductive oxide layer on the array substrate;

forming a first metal electrode layer on the transparent conductive oxide layer of a soldering region and a non-soldering region;

forming a second metal protective layer on the first metal electrode layer of the soldering region and the non-soldering region;

removing the second metal protective layer of the soldering region, wherein the transparent conductive oxide layer, the first metal electrode layer, and the second metal protective layer forms a pixel electrode; and providing a micro light emitting diode (LED) chip, wherein the micro LED chip comprises a pin, and the micro LED chip is soldered to the first metal electrode layer of the soldering region through the pin.

7. The method of manufacturing the display device according to claim 6, further comprising the following steps before removing the second metal protective layer of the soldering region, wherein the steps comprise:

depositing a pixel defining material on the array substrate and entire second metal protective layer; and providing a mask, wherein the mask is disposed on the pixel defining material, and the pixel defining material of the soldering region is removed by exposure and development processes, and a pixel defining layer is formed in the non-soldering region.

8. The method of manufacturing the display device according to claim 7, wherein the step of removing the second metal protective layer of the soldering region comprises removing the second metal protective layer of the soldering region through dry etching.

9. The method of manufacturing the display device according to claim 6, wherein the step of providing an array substrate comprises the following steps:

providing a substrate;

depositing a buffer material on the substrate to form a buffer layer;

depositing an oxide semiconductor material on the buffer layer and patterning the oxide semiconductor material to form an active layer;

depositing a gate insulating material on the active layer and patterning the gate insulating material to from a gate insulating layer;

depositing a metal material on the gate insulating layer and patterning the metal material to form a gate layer;

depositing an interlayer dielectric on the gate layer, the active layer, and the buffer layer to form an interlayer dielectric layer;

forming a first through hole penetrating the interlayer dielectric layer and extending to a surface of the active layer;

depositing a metal material in the first through hole and on the interlayer dielectric layer and patterning the metal material to form a common electrode, a source, and a drain, wherein the source and the drain are connected to the active layer;

forming a planar layer on the source, the drain, and the interlayer dielectric layer; and forming a second through hole penetrating the planar layer and extending to a surface of the drain and another second through hole penetrating the planar layer and extending to a surface of the common electrode in a drain corresponding region and in a common electrode corresponding region, respectively; and wherein the step of forming a transparent conductive oxide layer on the array substrate comprises depositing a transparent conductive oxide on a surface of the second through hole and the planar layer to form the transparent conductive oxide layer.

10. The method of manufacturing the display device according to claim 6, further comprising forming a packaging layer on the micro LED chip, a pixel defining layer, and a planar layer.

* * * * *